United States Patent [19]

Lanton

[11] 4,130,875
[45] Dec. 19, 1978

[54] APPARATUS FOR REDUCING THE SCALE FACTOR VARIATION FOR DIGITAL RESOLVER TYPE CONVERTERS AND THE LIKE

[75] Inventor: Seymour Lanton, Plainview, N.Y.

[73] Assignee: ILC Data Device Corporation, Bohemia, N.Y.

[21] Appl. No.: 774,696

[22] Filed: Mar. 4, 1977

[51] Int. Cl.² .................... G06J 1/00; H03K 13/02
[52] U.S. Cl. ........................ 364/603; 340/347 SY
[58] Field of Search ............... 235/186, 189, 150.52, 235/150.53; 340/347 SY; 364/602, 603, 606, 607, 730, 815

[56] References Cited

U.S. PATENT DOCUMENTS

| 3,478,198 | 11/1969 | Lewis et al. | 235/150.53 X |
| 3,696,407 | 10/1972 | Egerton, Jr. | 340/347 SY |
| 3,728,719 | 4/1973 | Fish | 340/347 SY X |
| 3,744,050 | 7/1973 | Hedrick | 340/347 SY X |
| 3,806,917 | 4/1974 | Gronner et al. | 340/347 SY X |

OTHER PUBLICATIONS

Hodges – "Digital-to-Synchro Converter" – IBM Technical Disclosure Bulletin, – vol. 12, no. 10, Mar., 1970–pp. 1639–1640.

Primary Examiner—Joseph F. Ruggiero
Attorney, Agent, or Firm—Lerner, David, Littenberg & Samuel

[57] ABSTRACT

In a digital-to-resolver type converter for generating sine and cosine functions over at least a predetermined angular range wherein variation of the scale factor from absolute value is remarkably improved by modification of the reference input wherein the sum of the sine and cosine signals are fed back in a positive sense, providing more than a 30 fold improvement in reduction of scale factor variation in one preferred embodiment.

18 Claims, 6 Drawing Figures

U.S. Patent  Dec. 19, 1978  4,130,875
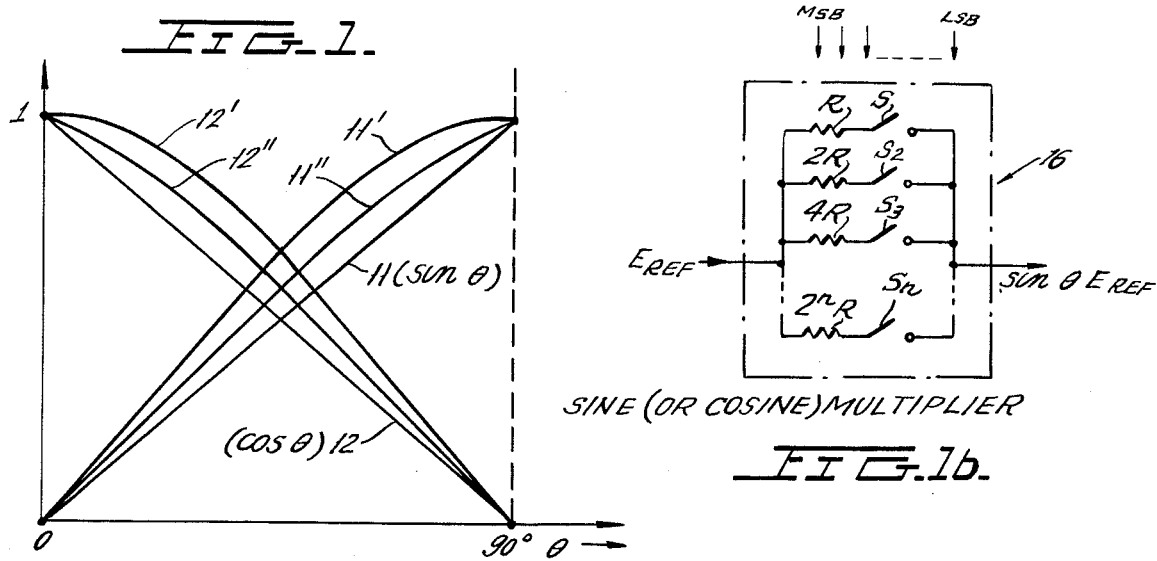
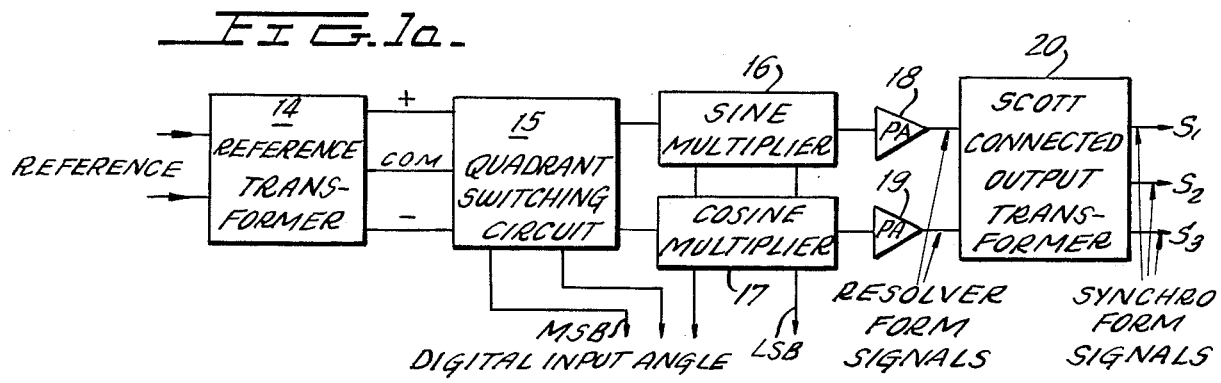
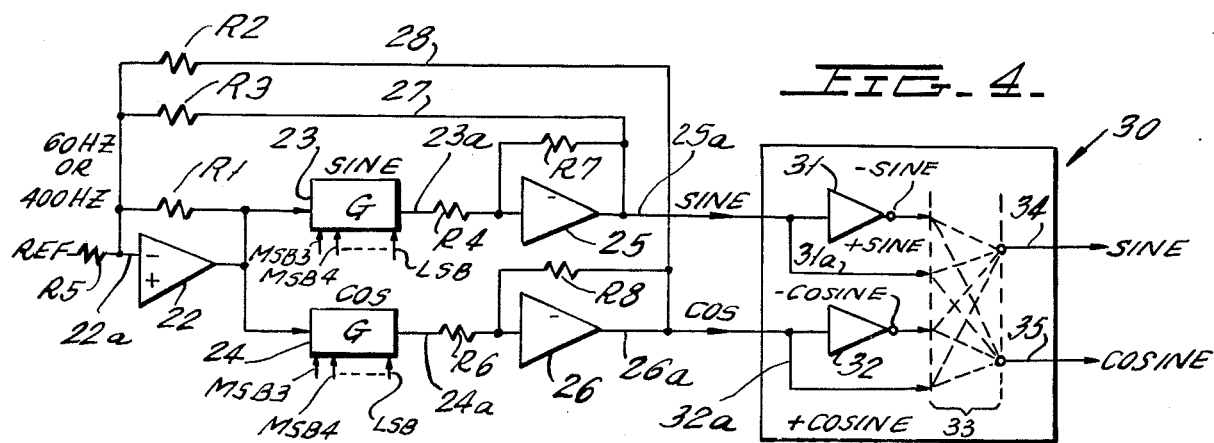
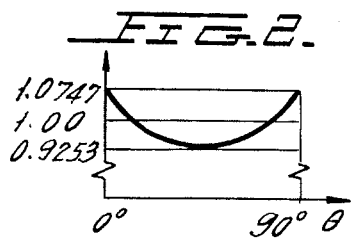
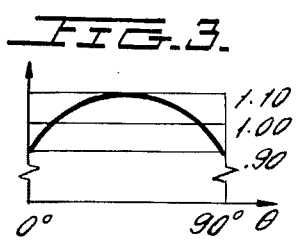

APPARATUS FOR REDUCING THE SCALE FACTOR VARIATION FOR DIGITAL RESOLVER TYPE CONVERTERS AND THE LIKE

BACKGROUND OF THE INVENTION

Digital-to-resolver converters of the solid state type accept parallel binary coded angle data and reference excitation to generate analog angle information. The reference input comprises an a.c. signal, typically of 60 or 400 Hertz which serves effectively as a carrier. Superimposed upon the carrier and by way of a linear binarily weighted ladder network the reference signal is modulated in accordance with the digital input for the purpose of generating sine and cosine functions, for example. Assuming the ladder network to be adapted to generate sine and cosine functions over a range of 0°–90°, the individual weighted resistance elements are selected accordingly. For example, in the case of a sine-cosine generator of the quadrant switching type, the resistive elements of the ladder network are selected so as to simulate a linear multiplier representation of sin $\theta$ and cos $\theta$ over the range from 0°–90°. Since the scale factor of the sine and cosine outputs over the range of the converter varies with angle and further since the sum of the absolute values of the sine and cosine output signals vary with angle, scale factor variation has been found to be greater than ± 7% which is significant enough to prevent use of such converters in a number of different applications. For example, it is not possible to use converters having a scale factor variation of this magnitude for driving cathode ray tube (CRT) displays. For example, if the sine and cosine signals were utilized as X and Y inputs, a somewhat "diamondshaped" pattern would result as opposed to a circle (or even nearly circular) figure. Such converters would also be incapable of being used in other applications requiring similar levels of accuracy.

Although the linear representation of sine and cosine over the prescribed angular range has been modified in present day converters by feeding the output of the ladder network through a warping resistor in order to more nearly simulate the sine and cosine function, the improvement in scale factor variation has not been found to provide a change in scale factor variation sufficient to permit use of such apparatus in applications requiring more exacting angle information signals.

BRIEF DESCRIPTION OF THE INVENTION

The present invention is characterized by providing a converter, preferably of the digital-to-resolver type, utilizing digitally controlled multiplier networks for generating signals over a predetermined angular range, which signals are representative of sine and cosine functions for the input angle over the aforesaid angular range. By summing the sine and cosine output signals and feeding these signals in a positive sense back to the reference input, a scale factor modification has been obtained which results in a scale factor variation improvement more than 30 times that of the prior art not using the novel technique, which improvement was obtained when the arrangement of the present invention was employed in a quadrant switching system. Employing the same technique in an octant switching converter system yielded an improvement in scale factor variation compared to an octant switching system not employing the technique of the present invention in which the technique of the present invention was found to provide an improvement in scale factor reduction of more than 100 times that obtained through an octant switching converter not employing the technique of the present invention. Optimal reductions in scale factor variations were further obtained by adjustment of resistance values of resistors employed in the operational amplifier feedback resistance elements and the resistance elements within the feedback paths between the sine and cosine outputs and the reference inputs.

OBJECTS OF THE INVENTION

It is therefore one object of the present invention to provide a novel apparatus and technique for use in digital-to-resolver converters and the like wherein a remarkable improvement in scale factor variation is obtained by feeding back the sum of the sine and cosine outputs of the converter in a positive sense for modification of the reference input.

It is another object of the present invention to provide a converter of the type described hereinabove wherein the aforementioned technique may be utilized in conversion systems employing quadrant, octant or other switching apparatus in combination with sine and cosine multipliers.

BRIEF DESCRIPTION OF THE FIGURES

The above as well as other objects of the present invention will become apparent when reading the accompanying description and drawings in which:

FIG. 1 shows a plot of curves useful in describing the background of the present invention.

FIG. 1a shows a typical digital-to-resolver (and digital to synchro) converter.

FIG. 1b shows a sine (or cosine) multiplier of the type employed in FIG. 1b in greater detail.

FIGS. 2 and 3 are plots showing additional curves useful in explaining the shortcomings of prior art converters.

FIG. 4 shows a schematic diagram of a circuit which may be employed in quadrant, octant or other types of switching converters and which embodies the principles of the present invention.

DETAILED DESCRIPTION OF THE INVENTION

Digital-to-resolver or digital-to-synchro converters are typically employed for the purpose of converting angle information in digital form into resolver or synchro form. Thus, for example, when angle information for a digital-to-synchro converter is presented, the output of the digital-to-synchro converter is expressed by the following equations $$E_{s1-s3} > K(\theta) E_{REF} \sin \theta$$

$$E_{s3-s2} = K(\theta) E_{REF} 1 \sin(\theta + 120°)$$

$$E_{s2-s1} = K(\theta) E_{REF} \sin(\theta + 240°) \quad (1)$$

where $S_1$, $S_2$, $S_3$ are the outputs of the synchro (electrically separated from one another by 120°)

$\theta$ = input angle presented in digital form $E_{REF}$ = E sin ($2\pi$ft) where f = 60 Hz or 400 Hz In the case of a digital-to-resolver converter, the outputs may be expressed by the equations $$E_{s1=s3} = -K(\theta) E_{REF} \sin \theta$$

$$E_{s2-s4} = K(\theta) E_{REF} \cos \theta \quad (2)$$

In the resolver form of converter, as shown in FIG. 1a, a reference input signal (typically 60 Hz or 400 Hz) is applied through reference transformer 14 to quadrant switching circuitry 15 and hence to sine and cosine multipliears 16 and 17 which serve to multiply or modulate the reference signal by sine $\theta$ and cosine $\theta$ function signals in accordance with a digital word applied thereto representing the input angle $\theta$ in digital form, the angular range for $\theta$ being 0°–90° for a quadrant switching converter. The outputs of the sine and cosine multiplier circuits, which are preferably linear binarily weighted ladder networks, see FIG. 1b, are electrical signals representing the product of the reference signal and the sine and cosine of the input angle, these values being amplifier at 18 and 19 to produce output signals in resolver form. The signals may be converted into sunchro form by means of a Scott connected output transformer 20 if desired.

Although this arrangement is satisfactory for most applications, since the sine and cosine multipliers are only approximate, it is not possible to utilize this technique for more exacting applications sine and cosine function signals having requiring a high degree of conformity to their ideal values. The multipliers actually have been found to deviate from the sine and cosine laws by an amount of the order of ± 7.5% but retain angular accuracy because of the ratio therebetween (i.e. the tangent) is substantially accurate.

FIG. 1 shows a plot of the curves 11 and 12 obtained from the linear sine and cosine multiplier circuits 16 and 17 of FIG. 1a, for example. From a consideration of these linear curves it can be seen that the tangent will be exact at each value. However, the deviation from actual sine and cosine curves 11' and 12' can clearly be seen to exist. The deviations between curves 11, 12 and 11', 12' may be reduced through the use of warping resistors (to be more fully described hereinbelow) to obtain the simulated and non-linear representations of sine and cosine as shown by waveforms 11" and 12". Considering FIG. 2, the scale factor (i.e. the vector sum of the outputs) which may be represented by the expression ($\sqrt{sin^2 \theta + cos^2 \theta}$) for a converter over the range from 0°–90° may be represented by the waveform as shown in FIG. 2. The scale factor over this range can be seen to vary by an amount equal to ± 7.47%.

The sum of the absolute values (i.e. magnitudes) of the sine and cosine output signals varies with changes in the angle $\theta$ in the manner shown in FIG. 3.

With this observation in mind, by feeding back the sum of the sine and cosine signals in a positive sense the reference input is modified, resulting in a modification and, in fact, a remarkable reduction in scale factor as a result thereof. For example, considering FIG. 4, there is shown therein an operational amplifier 22 having its input 22a coupled to receive a reference input signal, typically of 60 Hz or 400 Hz, through resistor R5. Resistor R1 is coupled between the output 22b and input 22a of operational amplifier 22. The reference signal is simultaneously coupled to the inputs of the sine and cosine multipliers 23 and 24 which are preferably single pole, single throw (SPST) digitally controlled linear binarily weighted ladder networks (see FIG. 1b) wherein the values of the individual resistor elements R, 2R, ... $2^nR$ within the ladder network are selected to provide an output signal representing the linear representations of sine and cosine over a predetermined range. In the present example, it will be assumed that the ladder network provides a linear representation over the range from 0°–90°.

One suitable linear binarily weighted ladder network which may be utilized is described in detail in application, Ser. No. 723,112 filed Sept. 14, 1976. FIG. 1 of the aforementioned application shows a combined multiplier circuit arrangement for generating both sine and cosine outputs, however, separate circuits may be utilized for each multiplier based upon the same general function generator design (i.e. of a ladder network of resistor elements of binarily weighted value). These resistive elements (R, 2R, etc.) are selectively connected between the input and output of the multipliers to modulate the reference signal, for example, as represented by equations (2) in accordance with binary input information representing for selectively opening or closing switches ($S_1$, $S_2$ etc.) in the circuit path of each resistance element so as to alter the conductivity of each multiplier from a maximum value G to a minimum value (ideally zero), the outputs of the sine and cosine multipliers being substantially complements of one another so that, for example, for the angle $\theta = 0°$, all switches of the multiplier 23 will be open whereas all switches of the multiplier 24 will be closed. Switches $S_1$, $S_2$, ... $S_n$ are preferably transistor switches but have been shown in symbolic form as mechanical switches for purposes of simplicity. The binary state of the digital inputs from the most significant bit (MSB) to the least significant bit (LSB) determine the state of their associated switches, i.e. open or closed.

The modulated reference signal from each output 23a and 24a is coupled through an associated warping resistor R4 and R6 respectively, to apply the modulated signals to operational amplifiers 25 and 26 respectively, where their outputs 25a and 26a generate signals representative of the product of the reference signal and sine and cosine of the angle $\theta$ whose digital input is applied to multipliers 23 and 24.

The warping resistors R4 and R6 are utilized to provide the simulated sine and cosine values as represented by the waveforms 11" and 12" of FIG. 1. The optimum values for these warping resistors is equal to 1.8 G wherein G is the conductivity of the multiplier circuit.

Resistors R7 and R8 are shown as being connected between the input and output of operational amplifiers 25 and 26 respectively. For optimum results, it has been found that these values are preferably adjusted so that their conductivities are 1.8G/2.8 wherein G is the maximum conductivity of the multipliers 23 and 24.

The outputs 25a and 26a are further connected by feedback paths 27 and 28 respectively, to common lead 29 and then to input 22a. Each of these paths is provided with a resistive element R2 and R3 respectively so as to positively feed back the sum of the sine and cosine signals through common lead 29 to reference input 22a. The optimum value for the resistance elements R2 and R3 when multipliers for use over an angle range from 0°–90° are employed are such that R1/R2 = R1/R3 = 0.3903.

The scale factor variation with angle is shown in Table 1 below.

TABLE 1

| ANGLE X 90° | SCALE FACTOR VARIATION |
|---|---|
| 0 | +0.204% |
| .05 | −0.026 |
| .10 | −0.156 |
| .15 | −0.202 |
| .20 | −0.176 |

TABLE 1-continued

| ANGLE X 90° | SCALE FACTOR VARIATION |
|---|---|
| .25 | −0.116 |
| .30 | −0.026 |
| .35 | +0.054 |
| .40 | +0.134 |
| .45 | +0.184 |
| .50 | +0.203 |

In order to provide a digital-to-resolver converter capable of providing sine and cosine output signals over the entire angular range from 0°–360°, the outputs 25a and 26a may be coupled to the quadrant switching circuit 30 which includes inverters 31 and 32 and switching network 33 so as to provide the appropriate sine and cosine output signals over the entire range from 0°–360°. For example, for the range from 0°–90°, the switch means is set by binary bits 1 and 2 to couple 31a to output 34 and to couple 32a to output 35. In the range from 90°–180° the binary input information is adapted to couple output 32a to sine output 34 and to couple output 31 to cosine output 35. The remaining four quadrants may be handled in a similar fashion. The dotted lines thus represent the possible switch positions dependent upon the binary states of the two most significant bits, MSB1 and MSB2, MSB3 through LSB being the digital input to each multiplier.

A consideration of the scale factor variations as set forth in Table I shows that improvement in scale factor variation is 7.47/0.204 = 36.6. This remarkable improvement greatly increases the number of exacting applications in which the present invention may be employed.

By appropriate adjustment of the resistive elements within the ladder networks of the sine and cosine multipliers, the output signals developed thereby may be altered to cover a different range such as, for example, the range from 0°–45° (i.e. the first octant of the sine and cosine function). Such being the case, with modification of the resistors within multipliers 23 and 24 of FIG. 4 to cover a range from 0°–45°, the resistance elements R1, R2 and R3 are also adjusted so that the feedback ratio is given by R1/R2 = R1/R3 = 0.349. With this feedback arrangement, Table 2 as set forth hereinbelow gives the factor variations for the values A=0 and A=0.349. Obviously, the octant switching system is operated by bits MSB1, MSB2 and MSB3 to cover the angular range from 0°–360° (i.e. 360°/45° = 8 = $2^3$).

TABLE 2

| ANGLE X 45° | SCALE FACTOR VARIATION | |
|---|---|---|
| | A=O | S=.349 |
| 0 | +1.41% | +0.013% |
| .05 | +0.86 | −0.002 |
| .10 | +0.38 | −0.100 |
| .15 | −0.04 | −0.012 |
| .20 | −0.41 | −0.010 |
| .25 | −0.71 | −0.006 |
| .30 | −0.95 | −0.001 |
| .35 | −1.14 | +0.005 |
| .40 | −1.28 | +0.009 |
| .45 | −1.36 | +0.012 |
| .50 | −1.39 | +0.013 |
| Peak = | 1.41% | 0.013% |

Considering the peak values over the octant range, the improvement is 1.41/0.013 or 108 thus yielding a remarkable reduction in scale factor variation from the actual sine and cosine values and enabling the converters of either quadrant or octant switching types to be employed in applications requiring a very high degree of precision.

For octant switching systems, the values R4 and R6 are adjusted so that their conductivities are equal to 9.09 G where G is the maximum conductivity of the sine and cosine multipliers. Similarly R7 and R8 are adjusted so that their conductivities are given by 9.09/10.09 G so as to obtain optimized results for the sine and cosine functions.

Although there has been described a preferred embodiment of this novel invention, many variations and modifications will now be apparent to those skilled in the art. Therefore, this invention is to be limited, not by the specific disclosure herein, but only by the appending claims.

What is claimed is:

1. Means for generating signals representative of sine and cosine of an angle $\theta$ where $\theta$ may vary over a predetermined range comprising:
   an input terminal for receiving a reference input signal;
   sine and cosine multiplier circuits each having first inputs for receiving said reference signal;
   said sine and cosine multiplier circuits further comprising a linear binarily weighted ladder network comprised of binarily weighted impedance elements and switch means connected in series therewith and responsive to binary input information representative of the angle $\theta$ for selectively opening or closing said switch means dependent upon the binary state of said binary input information whereby the multipliers modulate the reference signal whereby the modulation is a function of sine $\theta$ and cosine $\theta$;
   means for amplifying the outputs of said multipliers;
   means for summing said amplified outputs and for positively feeding back said sum to the reference input terminal for significantly reducing the scale factor variation of the sine and cosine output signals.

2. The apparatus of claim 1, wherein said ladder networks are designed to generate outputs whose levels vary over the range from 0°–45°.

3. The apparatus of claim 1, wherein said ladder networks are designed to generate sine and cosine functions over the range from 0°–90°.

4. The apparatus of claim 2 further comprising octant switching means coupled to receive the outputs of said sine and cosine multipliers to provide a digital-to-resolver converter apparatus for generating sine and cosine values over the range from 0°–360°.

5. The apparatus of claim 3 further comprising quadrant switching means coupled to said sine and cosine multipliers to provide a digital-to-resolver converter apparatus for generating sine and cosine values over the range from 0°–360°.

6. The apparatus of claim 1, wherein said summing means comprises first and second resistance elements $R_1$ and $R_2$ having first terminals respectively coupled to said first and second amplifiers and second terminals coupled in common to said reference input terminal.

7. The apparatus of claim 6 further comprising operational amplifier means coupled between said reference input terminal and the inputs of said sine and cosine multiplier circuits;
   a third resistance element $R_3$ coupled between the input and output of said operational amplifier.

8. The apparatus of claim 7, wherein $R_3 = 0.3903 R_2$ and $R_3 = 0.3903 R_1$.

9. The apparatus of claim 1, wherein said amplifier means comprises first and second operational amplifiers coupled to said multiplier circuits;

warping resistance elements coupled between the output of each of said multiplier circuits and the input of one of said operational amplifiers so that the combination of the warping resistor with its associated multiplier generates an output which more closely simulates the cosine and sine functions, respectively.

10. The apparatus of claim 9, wherein the conductivity of the sine and cosine multipliers equals G and wherein the conductivity of said warping resistors are selected so as to be equal to 1.8 G.

11. The apparatus of claim 10, wherein resistance elements are coupled between the inputs and outputs of each of said operational amplifiers, the values of the conductivity of said resistance elements being $1.8/2.8 \times G$.

12. The apparatus of claim 9, wherein the conductivity of the sine and cosine multipliers equals G and wherein the conductivity of said warping resistors are selected so as to be equal to 9.09 G.

13. The apparatus of claim 10, wherein resistance elements are coupled between the inputs and outputs of each of said operational amplifiers, the values of the conductivity of said resistance elements being $9.09/10.09 \times G$.

14. Means for generating signals representative of the sine and cosine of an angle $\theta$ where $\theta$ may vary over a predetermined range comprising:

an input terminal for receiving a reference input signal;

sine and cosine multiplier circuits each having first inputs for receiving said reference signal;

said sine and cosine multipliers including angle information input means being adapted to generate output signals equal to the product of the reference signal and sin $\theta$ and cos $\theta$ respectively wherein $\theta$ is applied to said angle information input means in binary form;

means for amplifying the output signals of said multipliers;

means for summing said amplified output signals and for positively feeding back said sum to the reference input terminal for significantly reducing the scale factor variation of the sine and cosine outputs.

15. The apparatus of claim 14, wherein impedance means are provided between each amplifier and said summing means for limiting the magnitude of the product signals summed by said summing means.

16. A digital to resolver converter for generating first and second non-linear output signals $S_1 (\theta)$ and $S_2 (\theta)$ which vary as a non-linear function of an angle $\theta$ comprising:

input means for receiving a constant frequency reference signal $E_{REF}$;

first and second non-linear function generator means responsive to the reference signal derived from said input means and to an angle information signal representing the desired angle $\theta$ in digital form for simultaneously generating first and second continuous, non-linear output signals, respectively, each of said signals being a product of the reference signal and the non-linear signals such that said first and second signals are of the form $E_{REF} S_1 (\theta)$ and $E_{REF} S_2 (\theta)$, respectively, both of said non-linear signals being sinusoidal functions;

first and second feedback means respectively coupling at least a portion of said first and second non-linear output signals in a positive feedback manner to said input means whereby said first and second non-linear outputs are both summed with said reference signal to significantly reduce the scale factor variation of the non-linear outputs.

17. The apparatus of claim 16 wherein one of said function generator means includes means for generating a sinusoidal output which is represented by sine $\theta$.

18. The apparatus of claim 16 further comprising octant switching means responsive to said first and second nonlinear outputs for generating first and second output signals which are sine and cosine functions covering the range from 0° to 360°.

* * * * *